United States Patent
Saito

(12) 
(10) Patent No.: US 6,230,294 B1
(45) Date of Patent: May 8, 2001

(54) TRANSIENT ANALYSIS DEVICE FOR ANALOG/DIGITAL MIXED CIRCUIT AND ANALYSIS METHOD THEREOF

(75) Inventor: Tatsuhito Saito, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/031,194

(22) Filed: Feb. 26, 1998

(30) Foreign Application Priority Data

Feb. 27, 1997 (JP) .................................................. 9-044036

(51) Int. Cl.[7] ....................................................... G06F 11/00
(52) U.S. Cl. ............................ 714/740; 714/741; 703/19; 703/14
(58) Field of Search .......................... 327/34; 395/500.36, 395/500.35; 375/361; 714/741, 740; 702/117; 364/578; 703/19, 14

(56) References Cited

U.S. PATENT DOCUMENTS

| 4,161,029 | * | 7/1979 | Frye et al. ............................ 702/117 |
| 4,531,223 | * | 7/1985 | Ashida ................................. 375/361 |
| 5,105,373 | * | 4/1992 | Rumsey et al. ..................... 364/578 |
| 5,481,484 | * | 1/1996 | Ogawa et al. .................. 395/500.35 |
| 5,687,088 | * | 11/1997 | Tomita ............................. 395/500.36 |
| 5,874,839 | * | 2/1999 | Wakimoto .............................. 327/34 |

FOREIGN PATENT DOCUMENTS 3-269673   12/1991   (JP) .

OTHER PUBLICATIONS

A. Vladimirescu, "C.W. Gear: The Spice Book", John Wiley & Sons, Inc.

* cited by examiner

*Primary Examiner*—Albert Decady
*Assistant Examiner*—David Ton
(74) *Attorney, Agent, or Firm*—Scully, Scott, Murphy & Presser

(57) ABSTRACT

A transient analysis device in which a simulation executing unit uses a first net list produced by a net list producing unit to measure a settling time of an analog/digital mixed circuit to be analyzed, after a dummy pulse parameter setting unit sets a parameter of a dummy pulse based on the measurement result, the net list producing unit converts, into a net list, a transfer function of a new circuit obtained as a result of the addition of a dummy pulse generation circuit for generating a dummy pulse whose parameter has been set to the analog/digital mixed circuit, and the simulation executing unit executes transient analysis processing by using a second net list produced with respect to the new circuit.

6 Claims, 10 Drawing Sheets

TRANSIENT ANALYSIS DEVICE FOR ANALOG/DIGITAL MIXED CIRCUIT AND ANALYSIS METHOD THEREOF

BACKGROUND OF THE INVENTION

1. Field of the Invention

The present invention relates to a transient analysis device which conducts transient analysis processing of an analog/digital mixed circuit to high precision and at high speed.

2. Description of the Related Art

As techniques of simulating operation of a circuit by means of a computer, various proposals have been made for a technique of conducting transient analysis of an analog/digital mixed circuit in which both an analog circuit and a digital circuit exist. One conventional analog/digital mixed circuit transient analysis technique is disclosed, for example, in Japanese Patent Laying-Open (Kokai) No. Heisei 3-269673, entitled "Analog/Digital Mixed Circuit Simulation Method". The literature discloses an analysis method intended to reduce a time required for transient analysis. Another transient analysis method of a kind is recited in "C. W. Gear: The Spice Book" (written by Andrei Vladimirescu, John Wiley & Sons, Inc.) These literatures recite algorithms of the Variable-Timestep method by Gear. FIG. 7 is a flow chart showing a conventional analog/digital mixed circuit transient analysis method recited in these literatures. FIG. 8 is a simulation equivalent block diagram of a device which conducts the transient analysis shown in FIG. 7.

With reference to FIGS. 7 and 8, first, generate a circuit diagram of an analog/digital mixed circuit 61 as a target for transient analysis (Step 701). Concrete example of structure of the analog/digital mixed circuit 61 is shown in FIG. 12. A 16-bit analog/digital mixed circuit shown in FIG. 12 includes a digital circuit 73 for receiving input of an operation clock signal 101 to output switching signals 1201 to 1208, 24 switches provided corresponding to a reference voltage $V_{REF}$, a ground potential and inputs of the switching signals 1201 to 1208, three OP amps. 70, 12 capacitors 71 and four resistors 72. The digital/analog mixed circuit then functions responsive to input of the operation clock signal 101 applied to the digital circuit 73 to output such an output signal 102 as shown in FIG. 14 through the OP amp. 70 in the last stage. FIG. 13 is a waveform diagram showing the operation clock signal 101 and the switching signals 1201 to 1208.

Next, convert the analog/digital mixed circuit 61 into a net list adapted to transient analysis simulation processing (Step 702), so that a simulator 62 conducts transient analysis using the generated net list (Step 703).

In the above-described conventional art, an analog circuit analysis algorithm for use in transient analysis is assumed to employ a variable analysis step method. The variable analysis step method represents an algorithm on which the amount of change in a potential of the analog/digital mixed circuit 61 output in response to the input of the operation clock signal 101 is traced to conduct analysis, for example, as shown in FIGS. 9 and 10, at a time step with a close pitch in time with respect to the operation causing the amount of potential change to have a sharp level-change (see an area J in FIG. 9 and an area N in FIG. 10) and conduct analysis at a time step with a loose pitch with respect to the operation causing the slow potential change (see an area K in FIG. 9 and an area O in FIG. 10).

According to the transient analysis method using this variable analysis method, conducting analysis with variable analysis steps closely set so as to generate an analysis point also for an operation part whose signal level change is slow in an analog circuit unit (see an area O in FIG. 10) results in having an increased number of analysis points for a signal of an operation part whose level change is sharp in the analog circuit unit (see an area N in FIG. 10) to increase an analysis time. On the contrary, when analysis are conducted with variable analysis steps loosely set in order to reduce an analysis time, while the number of analysis points for a signal of an operation part whose level change is sharp in the analog circuit unit (see an area J in FIG. 9) is reduced to reduce a transient analysis time, no analysis point is generated for a signal of an operation part whose level change is slow in the analog circuit unit (see an area K in FIG. 9), whereby a difference in a value of a simulator analysis signal from a value of a true output signal is increased to significantly decrease analysis precision.

As an example, when the analog/digital mixed circuit 61 as a target for analysis shown in FIG. 8 conducts FFT (fast Fourier transform) analysis of the 16-bit analog/digital mixed circuit shown in FIG. 12, conducting transient analysis to high precision requires an analysis point to be set also for a signal of a slow operation part in an analog unit (see the area O in FIG. 10). When an analysis point in question can not be obtained, transient analysis of the FFT in question for conducting analysis of a frequency and an amplitude value result in obtaining such a simulator analysis signal 105 as shown in FIG. 9 which has a value with a considerably large difference from that of the output signal 102 as a true output value. Conducting transient analysis demanded to have high analysis precision by the variable analysis step method therefore needs analysis steps to be closely set as illustrated in FIG. 10, which results in increasing the number of analysis points and an analysis time accordingly.

Another possible analysis algorithm for use in transient analysis is a fixed analysis step method. The fixed analysis step method represents an algorithm on which a potential of the output signal 102 of the analog circuit corresponding to an input of the operation clock signal 101 is analyzed at an analysis step $T_S$ with a fixed pitch as shown in FIG. 11. The fixed analysis step method has an advantage in that for the verification of a linear circuit element, analysis is possible in a relatively short transient analysis time.

In conventional transient analysis of an analog-digital mixed circuit, algorithms of the variable analysis step method or the fixed analysis step method are appropriately used to conduct transient analysis with respect to an analog/digital mixed circuit also including a non-linear circuit. In the simulation requiring analysis results with particularly high precision, when transient analyses are conducted according to a transient analysis method based on the fixed analysis step method, use of loose analysis steps $T_S$ prevents analysis results obtained by the simulation from converging and on the contrary, use of too close analysis steps $T_S$ enables analysis results to be converged but requires more analysis time as compared with that of a transient analysis method based on the variable analysis step method.

For conducting highly precise transient analysis of a complicated analog/digital mixed circuit according to a transient analysis method based on variable analysis steps, if variable analysis steps are closely set so as to generate an analysis point also at a slow operation part in an analog circuit, the number of analysis points at a sharp operation part in the analog circuit unit is increased to accordingly increase an analysis time.

On the contrary, loosely setting variable analysis steps in order to reduce an analysis time prevents generation of an analysis point at a slow operation part in the analog circuit unit, whereby an error in a value of a simulator analysis signal is increased to significantly degrade analysis precision.

In brief, a transient analysis method employing the fixed analysis step method has a shortcoming that improvement in analysis precision prevents analysis results of a non-linear element from converging, while a transient analysis method employing the variable analysis step method has a shortcoming that measures for improving analysis precision are inconsistent with measures for reducing an analysis time.

Moreover, with the above-described conventional transient analysis technologies, it is very difficult to designate such analysis steps as enable a minimum analysis time to be obtained within a range in which analysis precision necessary for an analog/digital mixed circuit to be analyzed is attained. It is therefore necessary to determine based on results obtained by actual execution of transient analysis whether required analysis precision is attained or not and when required precision is not attained, repetition of transient analysis with target precision further increased is essential, which results in further increasing a time required for analysis.

SUMMARY OF THE INVENTION

An object of the present invention is to provide a transient analysis device for an analog/digital mixed circuit enabling improvement in analysis precision to be consistent with reduction in time required for analysis processing by generating an analysis point for a signal of a slow operation part in an analog circuit unit of a circuit to be analyzed, as well as omitting an analysis point for a signal of a sharp operation part in the analog circuit unit, and an analysis method therefor.

According to the first aspect of the invention, a transient analysis device for conducting transient analysis processing of an analog/digital mixed circuit, comprises circuit diagram producing means for producing a circuit diagram of an analog/digital mixed circuit to be analyzed, net list producing means for converting a transfer function of the analog/digital mixed circuit corresponding to a circuit diagram produced by the circuit diagram producing means into a net list, simulation executing means for executing measurement of a settling time corresponding to an output signal of an analog circuit unit in the analog/digital mixed circuit and transient analysis processing, and dummy pulse parameter setting means for setting a parameter of a dummy pulse based on the result of measurement of a settling time by the simulation executing means, wherein the simulation executing means measures a settling time of the analog/digital mixed circuit by using a first net list produced by the net list producing means, after the dummy pulse parameter setting means sets a parameter of a dummy pulse based on the measurement result, the circuit diagram producing means produces a circuit diagram of a new circuit obtained as a result of the addition of a dummy pulse generation circuit for generating a dummy pulse whose parameter has been set to the analog/digital mixed circuit, the net list producing means converts a transfer function of the new circuit into a net list, and the simulation executing means executes transient analysis processing by using a second net list produced with respect to the new circuit.

In the preferred construction, the simulation executing means, in the settling time setting processing, measures a time from a rise and a fall of an operation clock applied to the analog/digital mixed circuit until when an output signal of the analog/digital mixed circuit settles, and sets a pulse width of the dummy pulse signal.

In the preferred construction, the simulation executing means jointly employs, as settling points, an analysis point set according to a time step analysis method and a measurement point set based on the timing of a rise and a fall of the dummy pulse to execute transient analysis.

In another preferred construction, the simulation executing means, in the settling time setting processing, measures a time from a rise and a fall of an operation clock applied to the analog/digital mixed circuit until when an output signal of the analog/digital mixed circuit settles, and sets a pulse width of the dummy pulse signal, and in transient analysis processing, jointly employs, as settling points, an analysis point set according to a time step analysis method and a measurement point set based on the timing of a rise and a fall of the dummy pulse to execute transient analysis.

According to the second aspect of the invention, a transient analysis method of conducting transient analysis processing of an analog/digital mixed circuit, comprising the steps of producing a circuit diagram of an analog/digital mixed circuit to be analyzed, producing a first net list corresponding to the circuit diagram, measuring a settling time corresponding to an output signal of an analog circuit unit in the analog/digital mixed circuit by using the first net list, determining a parameter of a dummy pulse signal based on the result of measurement of a settling time to add a dummy pulse generation circuit for generating a dummy pulse for setting a settling point for use in transient analysis to the analog/digital mixed circuit, producing a second net list corresponding to a new circuit obtained as a result of the addition of the dummy pulse generation circuit to the analog/digital mixed circuit, and conducting transient analysis by using the second net list.

In the preferred construction, the settling time measuring step comprises the steps of measuring a time from a rise and a fall of an operation clock applied to the analog/digital mixed circuit until when an output signal of the analog/digital mixed circuit settles, and setting a pulse width of the dummy pulse signal based on the measurement result.

In the preferred construction, the transient analysis executing step comprises the step of jointly employing an analysis point set according to a time step analysis method and a measurement point set based on the timing of a rise and a fall of the dummy pulse as settling points for use in transient analysis processing.

In another preferred construction, the settling time measuring step comprises the steps of measuring a time from a rise and a fall of an operation clock applied to the analog/digital mixed circuit until when an output signal of the analog/digital mixed circuit settles, and setting a pulse width of the dummy pulse signal based on the measurement result, and the transient analysis executing step comprises the step of:

jointly employing an analysis point set according to a time step analysis method and a measurement point set based on the timing of a rise and a fall of the dummy pulse as settling points for use in transient analysis processing.

According to another aspect of the invention, a computer readable memory storing a control program for controlling a transient analysis device which conducts transient analysis processing of an analog/digital mixed circuit, the control program comprising the steps of producing a circuit diagram of an analog/digital mixed circuit to be analyzed, producing a first net list corresponding to the circuit diagram, measuring a settling time corresponding to an output signal of an analog circuit unit in the analog/digital mixed circuit by using the first net list, determining a parameter of a dummy pulse signal based on the result of measurement of a settling time to add a dummy pulse generation circuit for generating a dummy pulse for setting a settling point for use in transient analysis to the analog/digital mixed circuit, producing a second net list corresponding to a new circuit obtained as a result of the addition of the dummy pulse generation circuit to the analog/digital mixed circuit, and conducting transient analysis by using the second net list.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
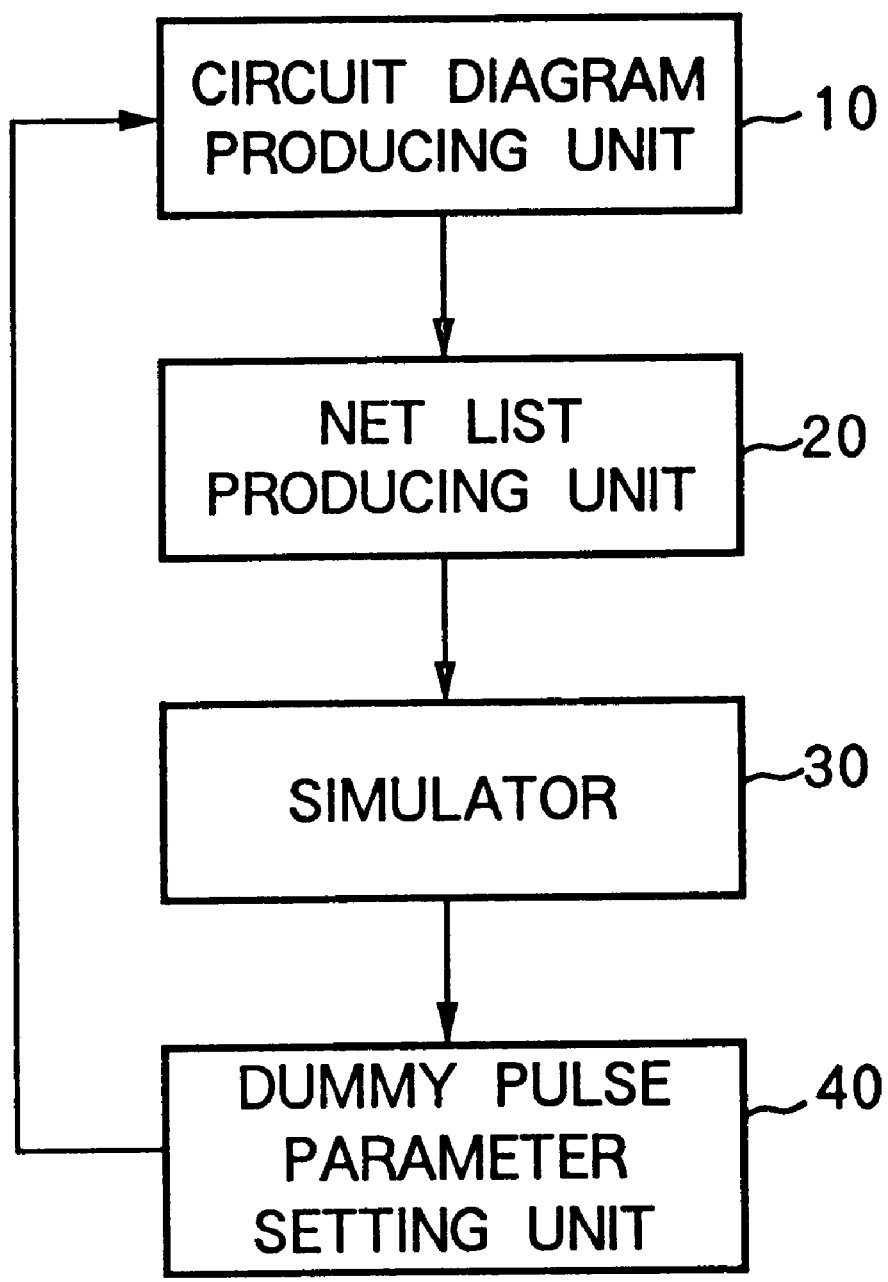
FIG. 1 is a functional block diagram showing a function of a transient analysis device for an analog/digital mixed circuit according to one embodiment of the present invention.

FIG. 1 is a functional block diagram showing structure of a transient analysis device for an analog/digital mixed circuit according to one embodiment of the present invention. With reference to FIG. 1, the transient analysis device for an analog/digital mixed circuit according to the present embodiment includes a circuit diagram producing unit 10 for producing a circuit diagram of an analog/digital mixed circuit to be analyzed, a net list producing unit 20 for converting a transfer function of the analog/digital mixed circuit into a net list, a simulator 30 for conducting measurement of a settling time and transient analysis processing, and a dummy pulse parameter setting unit 40 for setting a parameter of a dummy pulse based on a result of the measurement of a settling time by the simulator 30. In FIG. 1, illustration is made only of a characteristic part of the structure of the present embodiment and that of the remaining common part is omitted.

The above-described respective components are implemented by a computer-program-controlled computer system such as a work station or a personal computer. The computer program is provided as storage in a storage medium such as a magnetic disk or a semiconductor memory and loading of the same into a processing device of the computer system to control the computer system leads to realization of the above-described functions.

In the present embodiment, the circuit diagram producing unit 10 produces a circuit diagram of an analog/digital mixed circuit to be analyzed. One of concrete examples of structure of an analog/digital mixed circuit to be analyzed is a 16-bit analog/digital mixed circuit shown in FIG. 12.

As a first function, the net list producing unit 20 converts a transfer function of an analog/digital mixed circuit to be analyzed into a net list adapted to transient analysis simulation processing. As a second function, the unit 20 converts, into a net list, a transfer function of a new circuit obtained as a result of the addition of a dummy pulse generation circuit whose parameter has been set by the dummy pulse parameter setting unit 40 to the circuit to be analyzed.

Figure 5:
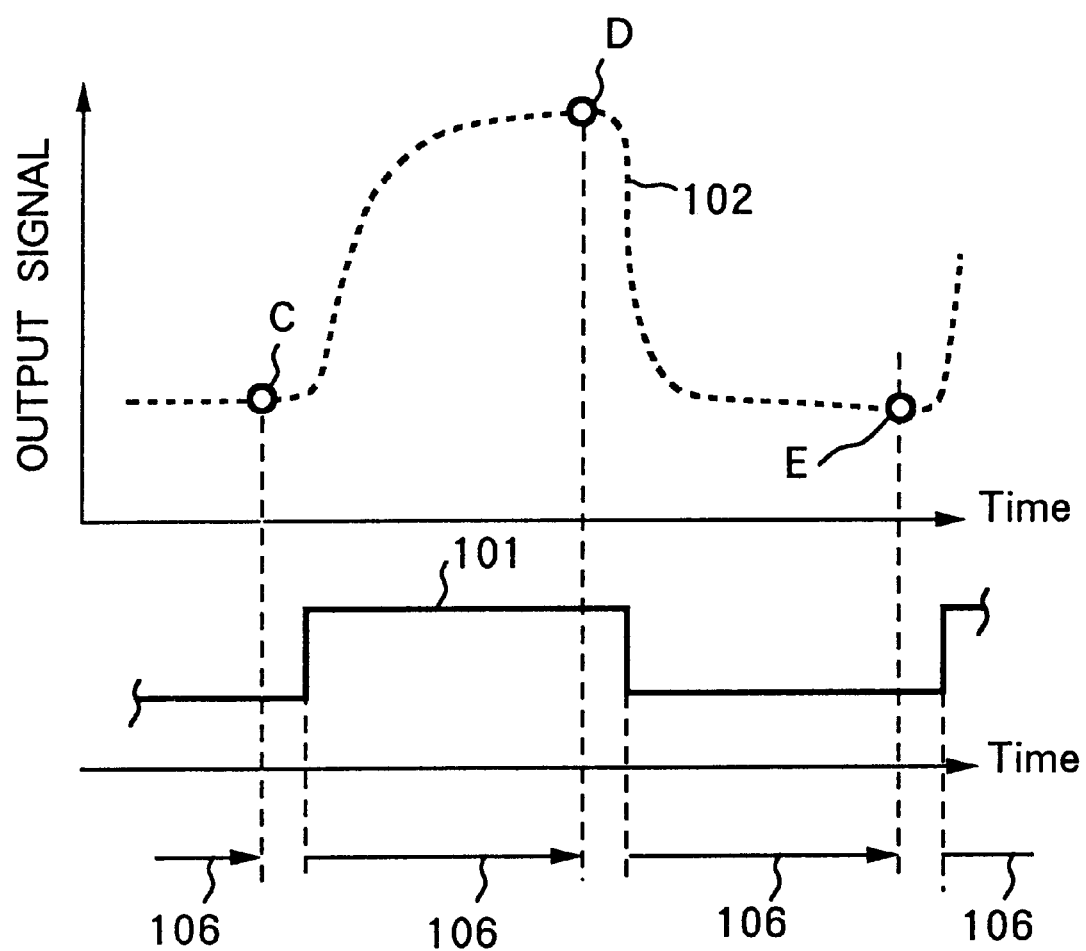
FIG. 5 is a diagram showing a relationship between an operation clock signal and a settling time regarding an output signal of an analog/digital mixed circuit.

The simulator 30 conducts measurement of a settling time necessary for transient analysis and transient analysis processing by using a net list produced by the net list producing unit 20. In the measurement of a settling time, the unit 30 uses a signal whose cycle is relatively short to conduct measurement. With reference to FIG. 5 which shows a relationship between a settling time related to an output signal and an operation clock signal, a settling time 106 represents a time from a point of level change of an operation clock signal 101 applied to an analog/digital mixed circuit until when an output signal 102 of the analog/digital mixed circuit settles. In FIG. 5, points C, D and E indicated on the output signal 102 are settling points. In this embodiment, transient analysis are conducted based on the variable analysis step method.

Figure 6:
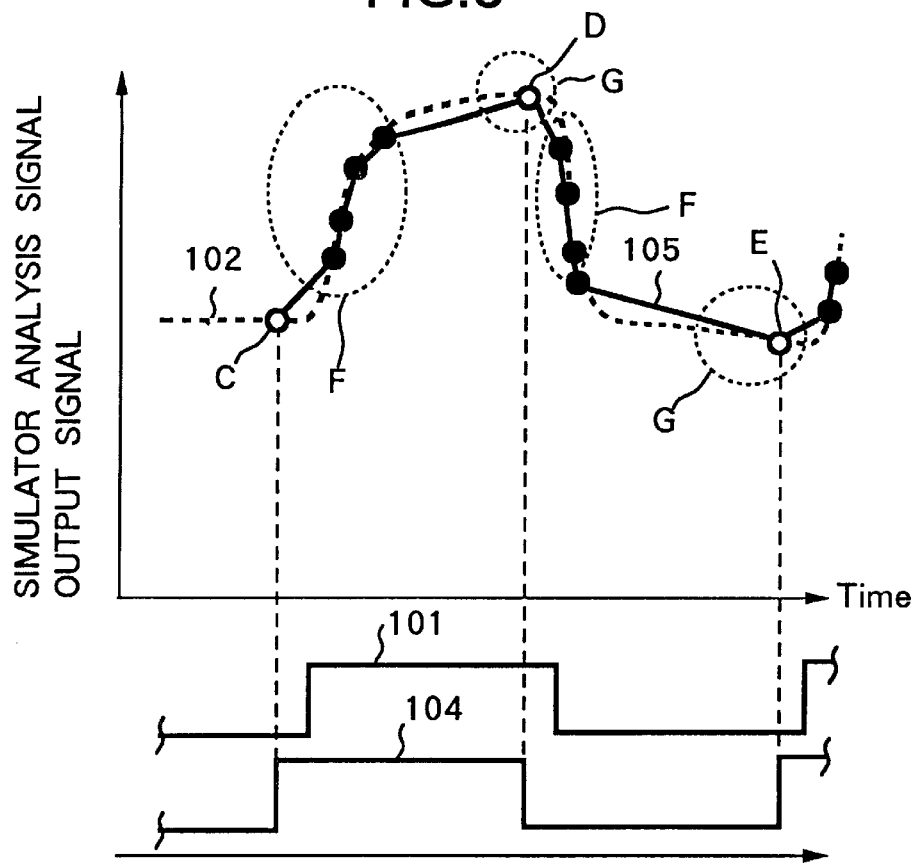
FIG. 6 is a diagram showing a relationship between an operation clock signal and a dummy pulse, and an output signal of an analog/digital mixed circuit and a simulator analysis signal.
Figure 7:
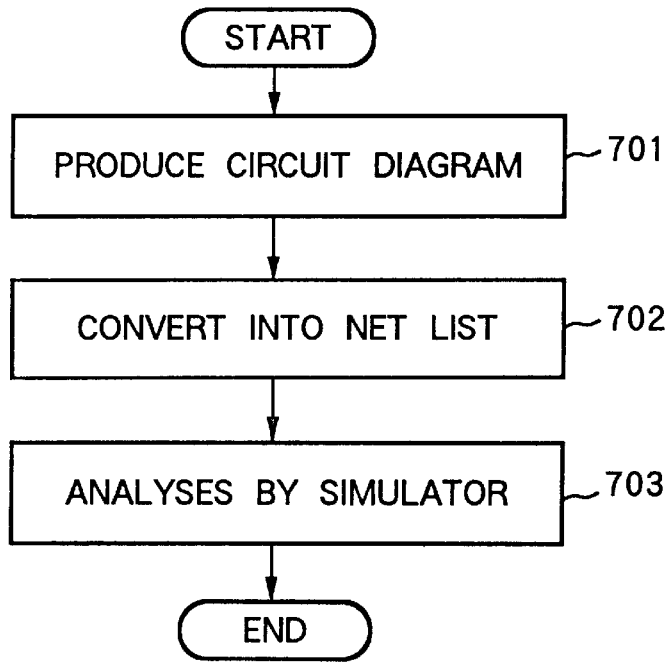
FIG. 7 is a flow chart showing a procedure of conventional transient analysis processing.
Figure 8:
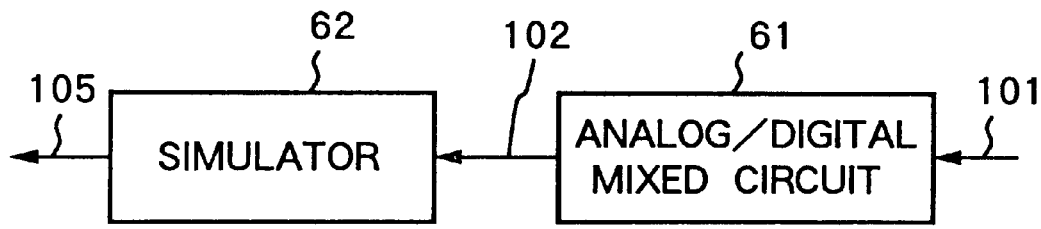
FIG. 8 is a simulation equivalent block diagram of a conventional transient analysis device for an analog/digital mixed circuit.
Figure 9:
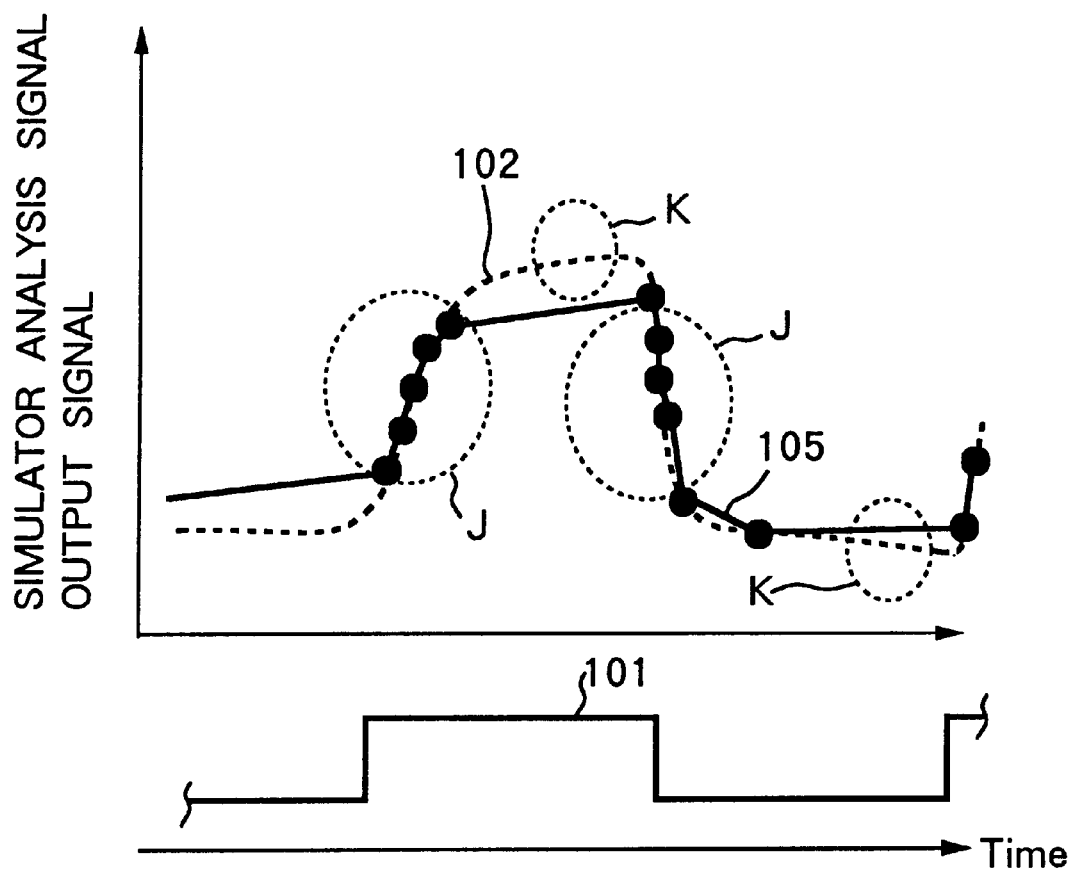
FIG. 9 is a diagram showing a relationship between an operation clock signal, and an output signal of an analog/digital mixed circuit and a simulator analysis signal in a case where loose analysis steps are applied in conventional transient analysis processing employing the variable analysis step method.
Figure 10:
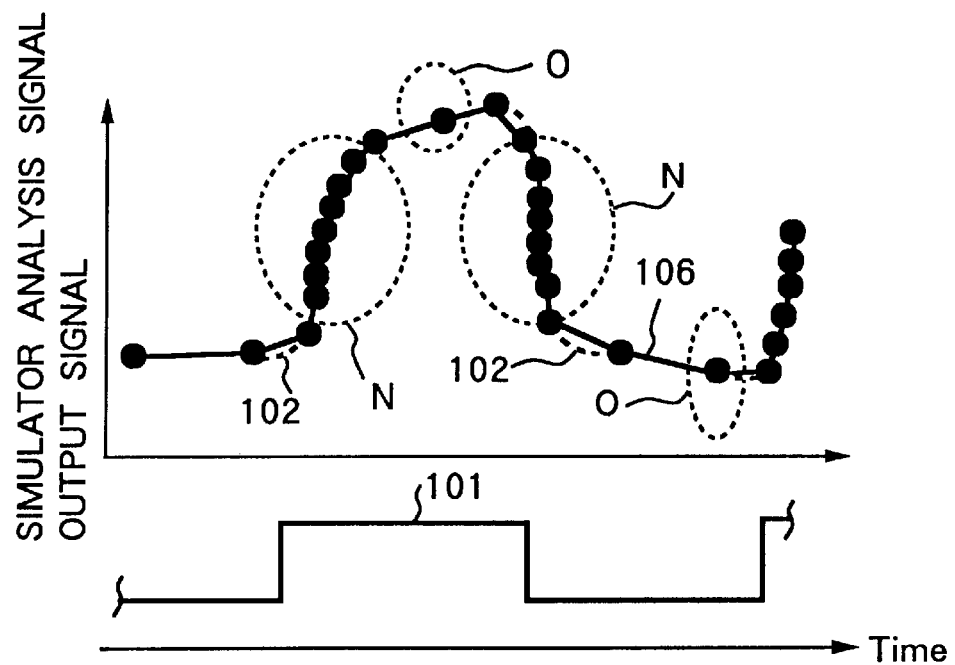
FIG. 10 is a diagram showing a relationship between an operation clock signal, and an output signal of an analog/digital mixed circuit and a simulator analysis signal in a case where close analysis steps are applied in conventional transient analysis processing employing the variable analysis step method.
Figure 11:
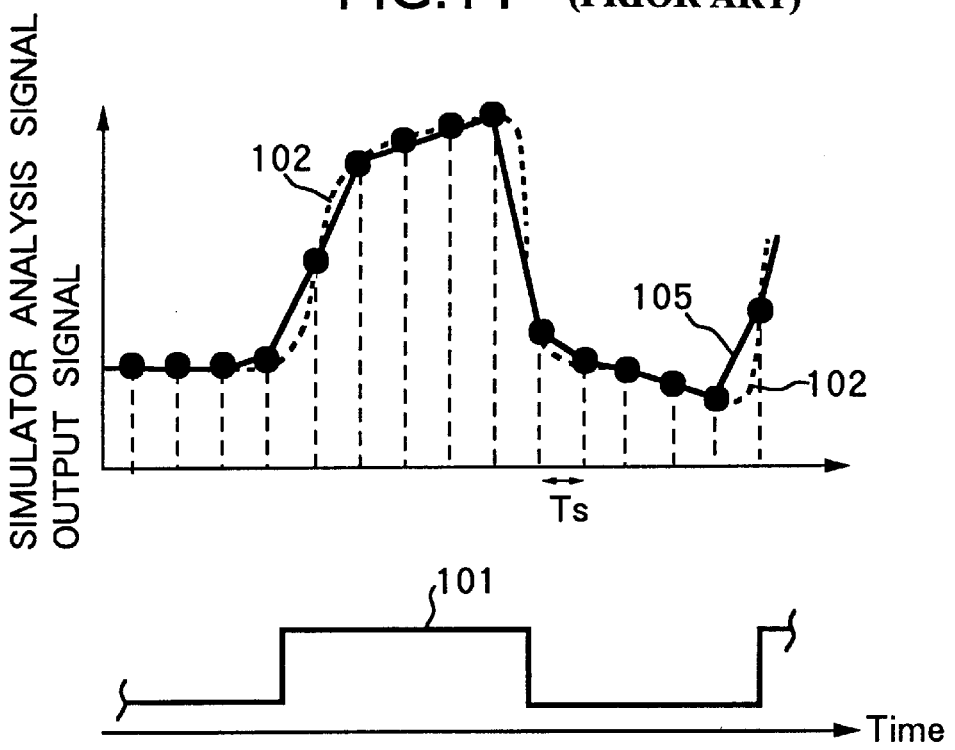
FIG. 11 is a diagram showing a relationship between an operation clock signal, and an output signal of an analog/digital mixed circuit and a simulator analysis signal in conventional transient analysis processing employing the fixed analysis step method.

The dummy pulse parameter setting unit 40 determines a time for generating an edge of a dummy pulse based on a result of measurement of a settling time by the simulator 30. With reference to FIG. 6 which shows a relationship between an operation clock signal and a dummy pulse, and an output signal and a simulator analysis signal, a dummy pulse 104 rises at the settling point C corresponding to the settling time 106 of the analog circuit unit shown in FIG. 5, falls at the settling point D and then again rises at the settling point E. The reason why analysis points are thus generated corresponding to the settling time 106 is that precision of results of analysis of a potential change at a slow operation part in the analog circuit unit should be improved. As a concrete manner of determining a time for generating an edge as a parameter of the dummy pulse 104, it is set, as described above, such that timing of a leading or trailing edge of the dummy pulse 104 and timing in analysis time of a settling point detected by the measurement of a settling time by the simulator 30 coincide with each other.

Figure 2:
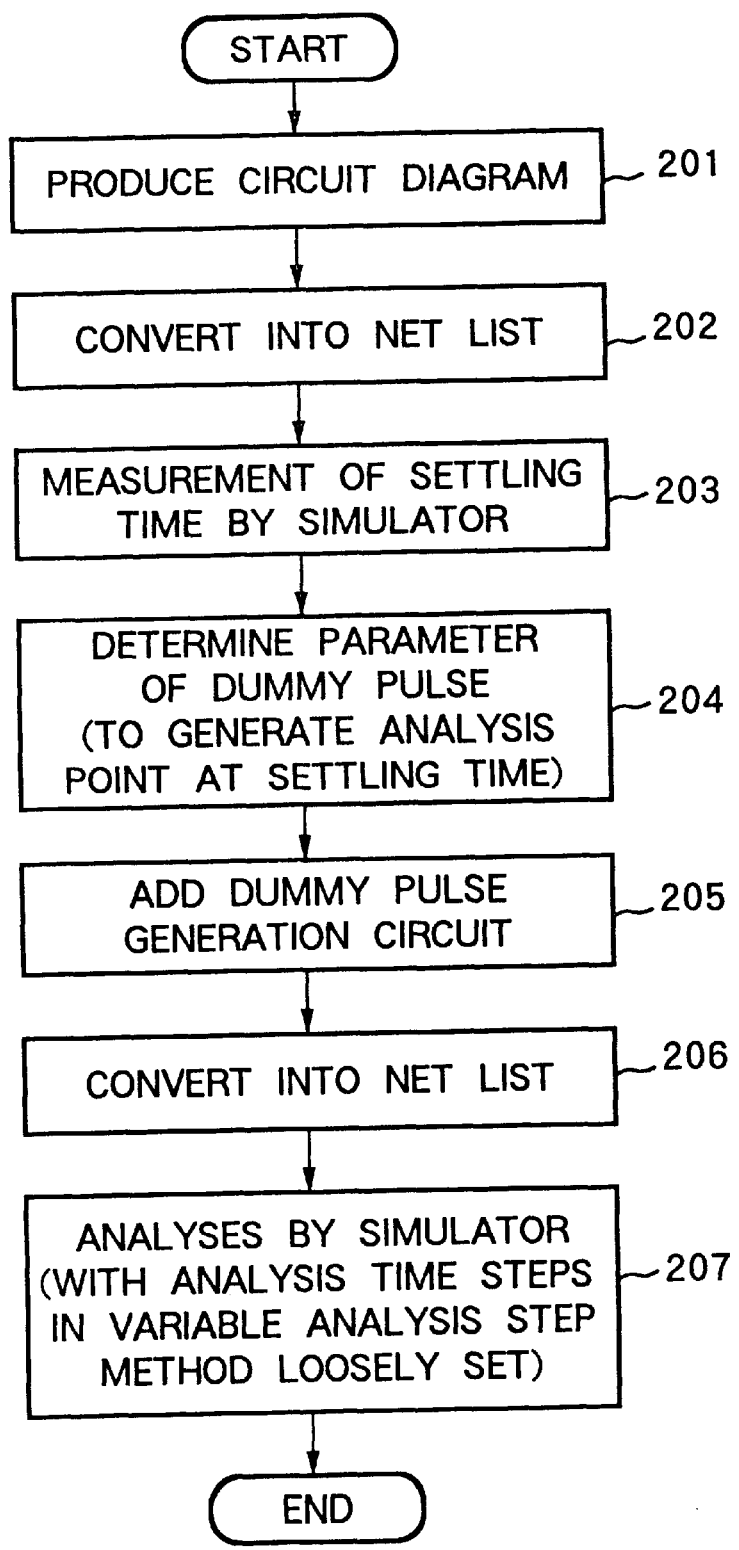
FIG. 2 is a flow chart showing a procedure of transient analysis processing according to the present embodiment.
Figure 3:
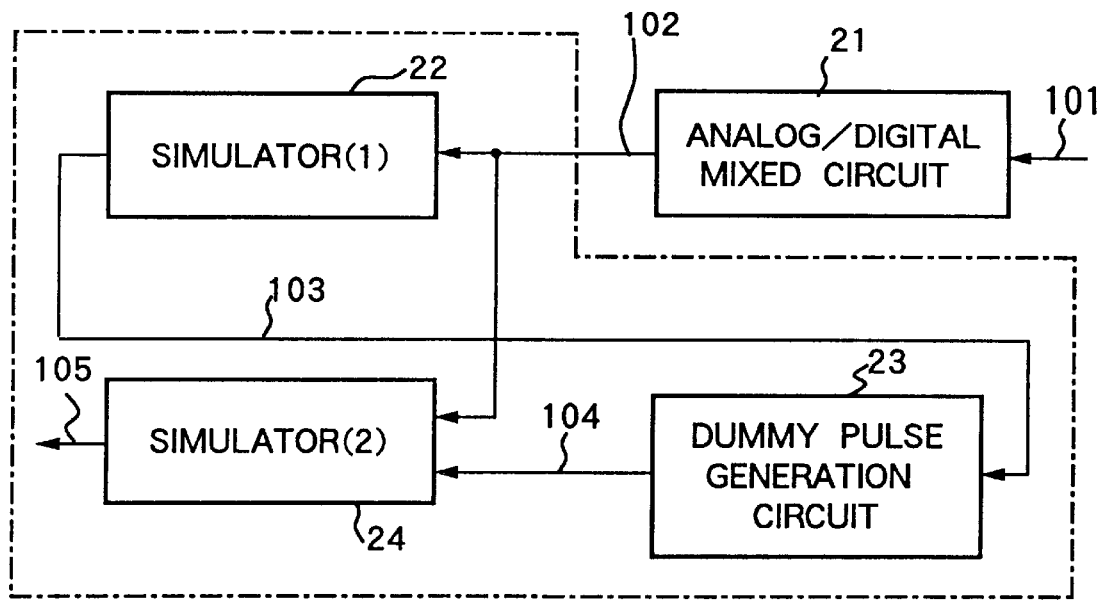
FIG. 3 is a simulation equivalent block diagram of the transient analysis device for an analog/digital mixed circuit according to the present embodiment.
Figure 4:
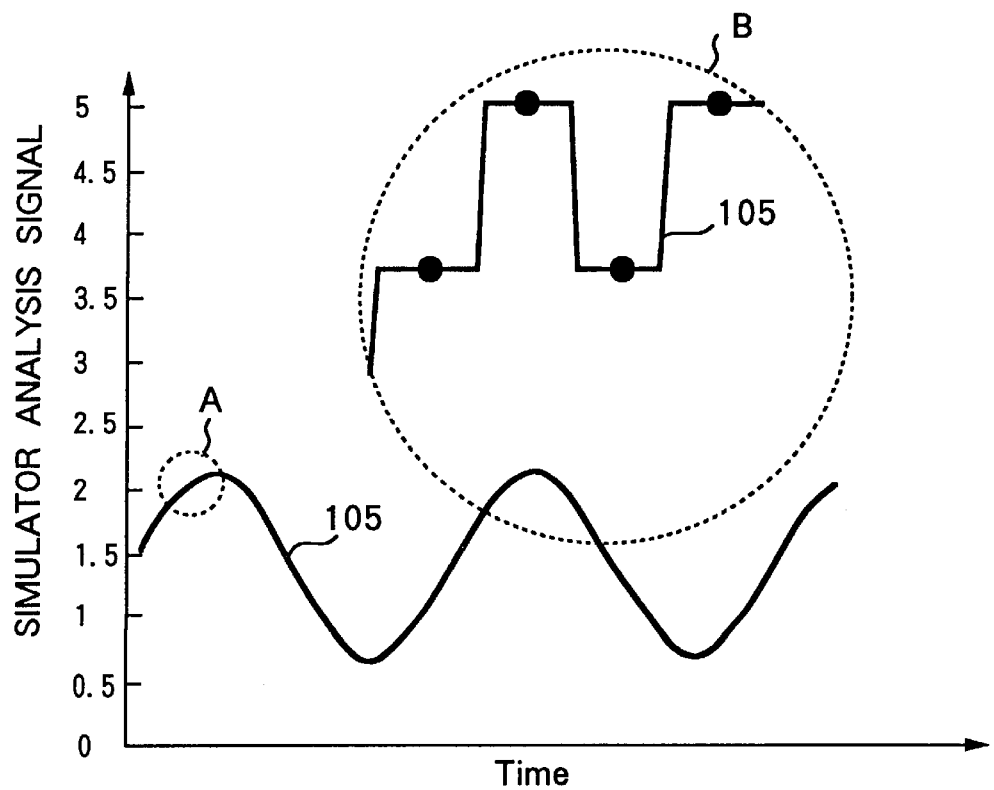
FIG. 4 is a waveform diagram illustrating an analysis signal output from the simulation equivalent block of FIG. 3.

Thus structured circuit diagram producing unit 10, net list producing unit 20, simulator 30 and dummy pulse parameter setting unit 40 circularly execute the processing twice, thereby enabling an appropriate settling point for an output of the analog/digital mixed circuit to be set. FIG. 2 shows a flow chart indicative of operation of the present embodiment, while FIG. 3 shows a simulation equivalent block diagram according to the present embodiment. FIG. 4 is a waveform diagram illustrating an ultimate analysis signal 105 in the simulation equivalent block of FIG. 3. In FIG. 4, a waveform indicated in an area B surrounded by a broken line is an expansion of a waveform of an area A of the analysis signal 105 surrounded by a broken line. A plurality of black dots on the waveform diagram in the area B denote ideal settling points. More specifically, setting a settling point at the position of the black dot illustrated on the waveform of the analysis signal 105 enables ideal transient analysis. In the following, operation of the present embodiment will be described with reference to FIGS. 2 and 3.

First, the circuit diagram producing unit 10 produces a circuit diagram of an analog/digital mixed circuit 21 to be analyzed shown in FIG. 3 (Step 201). Then, the net list producing unit 20 converts a transfer function of the analog digital mixed circuit 21 into a net list (Step 202).

Next, using the net list produced at Step 202 and using a signal whose cycle is relatively short, the simulator 30 measures a settling time necessary for transient analysis (Step 203). This function is illustrated as a first simulator 22 in the simulation equivalent block of FIG. 3. With reference to FIG. 3, the first simulator 22 receives input of the output signal 102 from the analog/digital mixed circuit 21 to output a settling time measurement result 103.

Next, the dummy pulse parameter setting unit 40 determines a time for generating a parameter of the dummy pulse 104, that is, an edge of the dummy pulse 104, based on the settling time measurement result 103 obtained at Step 203 (Step 204).

Next, again returning to the processing of the circuit diagram producing unit 10, the parameter of the dummy pulse 104 is incorporated into the circuit diagram of the analog/digital mixed circuit 21, so that as shown in FIG. 3, a dummy pulse generation circuit 23 for generating and outputting the dummy pulse 104 is added as an independent circuit to the analog/digital mixed circuit 21 (Step 205). The dummy pulse generation circuit 23 is composed of only one clock generator using a library of the first simulator 22.

Then, returning to the processing of the net list producing unit 20, a transfer function of the new circuit to which the dummy pulse generation circuit 23 has been added at Step 205 is converted into a net list (Step 206). Then, using the net list produced at Step 206, the simulator 30 conducts transient analysis, with transient analysis steps in the variable analysis steps method loosely set (Step 207).

The foregoing operation results in generation and outputting of a desired simulation analysis signal 105. In transient analysis using the transient analysis device for an analog/digital mixed circuit according to the present embodiment, therefore, a number of redundant analysis points of a signal at an operation part in an analog circuit unit involving a sharp level change at a change point of a digital clock is reduced to shorten an analysis time and also an analysis point is generated by a dummy pulse for a signal of an operation part whose level change is slow in the analog circuit unit, whereby highly precise analysis results with less analysis error can be obtained.

Figure 12:
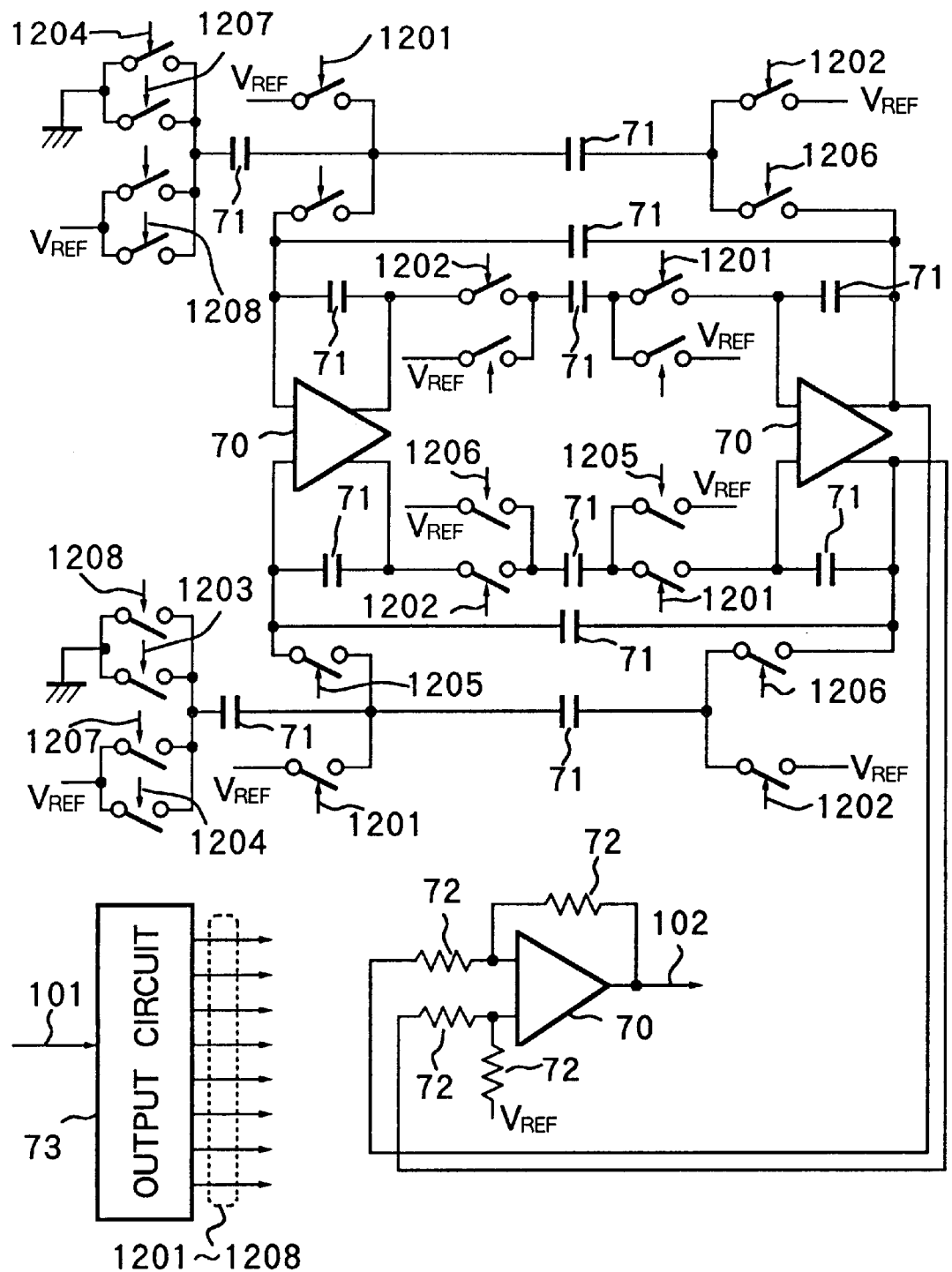
FIG. 12 is a circuit diagram showing one example of an analog/digital mixed circuit.
Figure 13:
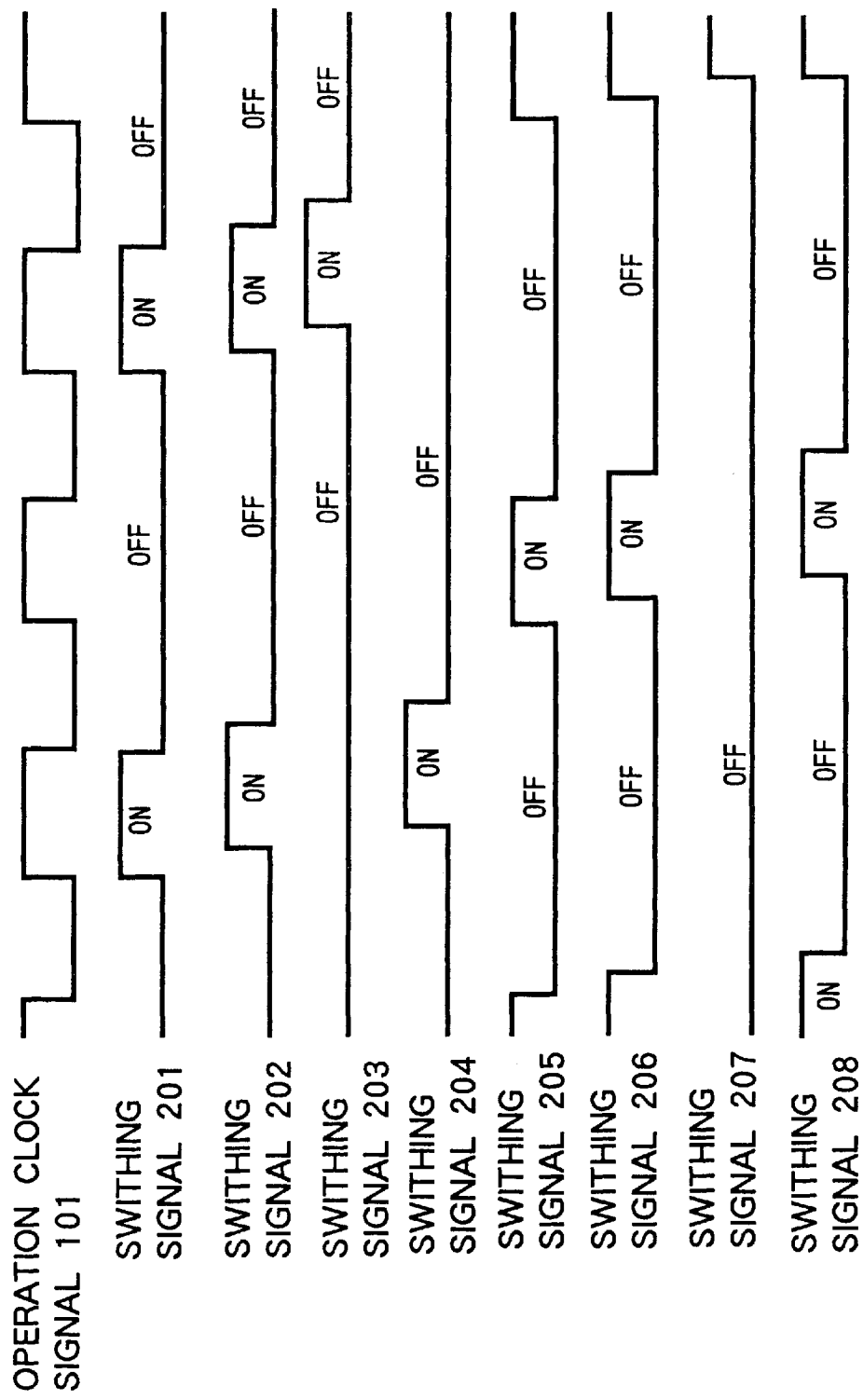
FIG. 13 is an operation timing chart showing an operation clock signal and a switching signal of the analog/digital mixed circuit shown in FIG. 12.
Figure 14:
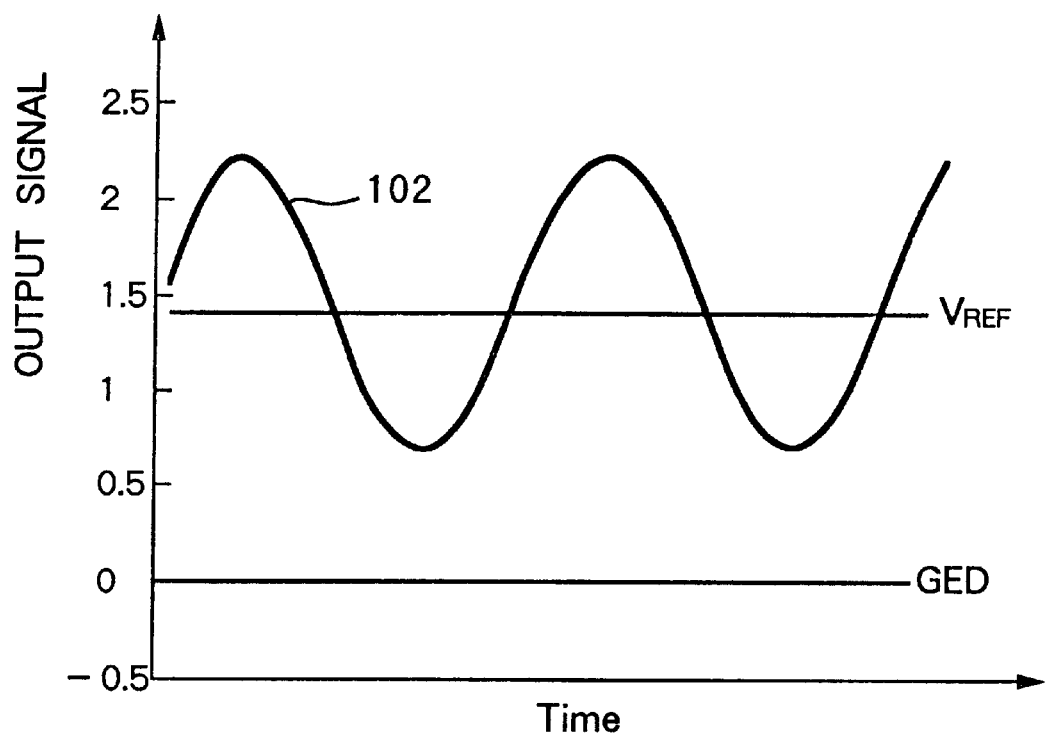
FIG. 14 is an operation timing chart showing an output signal of the analog/digital mixed circuit shown in FIG. 12.

In the application of the transient analysis according to the present invention, with the analog/digital mixed circuit of FIG. 12 as a target for analysis, an example of display of an output signal of the analog/digital mixed circuit and a simulator analysis signal is as shown in FIGS. 5 and 6. In this case, transient analysis are tried under the conditions of analysis that a reference voltage $V_{REF}$ should be set to 3V and an operation clock signal to 13 MHz, and an analysis precision of the variable analysis step method should be set to one-thousandth that of the conditions for conventional transient analysis. In actual designation of analysis precision, a value within an allowable error range of a local truncation error in a numerical integration algorithm is designated to be equal to or less than 1 mV. In other words, 1000 times the value equal to or less than 1 uV designated in conventional transient analysis. In the present embodiment, since analysis steps are loosely set (one-thousandth the analysis precision required for conventional transient analysis) as shown in FIG. 6, the number of analysis points at a part of sharp operation change in the analog circuit unit (see the area F in FIG. 6) is reduced to drastically shorten a time required for transient analysis. Moreover, since an analysis point (see G in FIG. 6) is generated corresponding to an edge of the dummy pulse 104 corresponding to the area F in FIG. 6, analysis results true to the true output signal 102 can be obtained.

As an example of comparison between the functions of the present invention and those of conventional art, it is confirmed that with a 16-bit analog/digital mixed circuit as a target for analysis, comparison and collation of transient analysis precision and analysis times, with the same transient analysis precision, result in that a time required for the analysis according to the present embodiment falls within approximately 10 percent of a time required for conventional transient analysis.

As described in the foregoing, by using a simple dummy pulse generation circuit usable by a common simulator to use a dummy pulse output from the dummy pulse generation circuit, the transient analysis device for an analog/digital mixed circuit and an analysis method thereof according to the present invention allow an analysis point to be generated also for a signal of a slow operation part of an analog circuit unit in a circuit to be analyzed, as well as efficiently omitting an analysis point for a signal of a sharp operation part in the analog circuit unit such as at a point of change of a digital clock signal, whereby reduction in the amount of calculation by a simulator is possible. As a result, improvement in analysis precision and reduction in time required for analysis processing can be compatible with each other.

In addition, since timing for generating an edge of a dummy pulse is determined by first processing executed by a simulator with respect to a circuit to be analyzed and then transient analysis as second processing to be executed by the simulator are conducted with respect to a new circuit obtained as a result of the addition of a dummy pulse generation circuit which has received the results to the circuit to be analyzed, one transient analysis processing enables analysis results with high precision to be obtained, as well as enabling reduction in time for analysis.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A transient analysis device for conducting transient analysis processing of an analog/digital mixed circuit, comprising:

circuit diagram producing means for producing a first circuit diagram of an analog/digital mixed circuit to be analyzed;

net list producing means for converting a transfer function of said analog/digital mixed circuit corresponding to the first circuit diagram produced by said circuit diagram producing means into a first net list;

simulation executing means for executing measurement of a settling time corresponding to an output signal of an analog circuit unit in said analog/digital mixed circuit and transient analysis processing, said simulation executing means measuring a settling time of said analog/digital mixed circuit by using the first net list produced by said net list producing means; and dummy pulse parameter setting means for setting a parameter of a dummy pulse based on the result of measurement of the settling time by said simulation executing means, wherein after said dummy pulse parameter setting means sets a parameter of a dummy pulse based on the measurement result, said circuit diagram producing means produces a second circuit diagram of a new second circuit obtained as a result of the addition of a dummy pulse generation circuit for generating a dummy pulse whose parameter has been set to said analog/digital mixed circuit, said net list producing means converts a transfer finction of the new second circuit into a second net list, and said simulation executing means executes transient analysis processing by using the second net list produced with respect to said new second circuit; and said simulation executing means jointly employs, as settling points, an analysis point set according to a time step analysis method and a measurement point set based on the timing of a rise and a fall of said dummy pulse to execute transient analysis.

2. A transient analysis device for conducting transient analysis processing of an analog/digital mixed circuit, comprising:

circuit diagram producing means for producing a first circuit diagram of an analog/digital mixed circuit to be analyzed;

net list producing means for converting a transfer function of said analog/digital mixed circuit corresponding to the first circuit diagram produced by said circuit diagram producing means into a first net list;

simulation executing means for executing measurement of a settling time corresponding to an output signal of an analog circuit unit in said analog/digital mixed circuit and transient analysis processing, said simulation executing means measuring a settling time of said analog/digital mixed circuit by using the first net list produced by said net list producing means; and dummy pulse parameter setting means for setting a parameter of a dummy pulse based on the result of measurement of the settling time by said simulation executing means, wherein after said dummy pulse parameter setting means sets a parameter of a dummy pulse based on the measurement result, said circuit diagram producing means produces a second circuit diagram of a new second circuit obtained as a result of the addition of a dummy pulse generation circuit for generating a dummy pulse whose parameter has been set to said analog/digital mixed circuit, said net list producing means converts a transfer function of the new second circuit into a second net list, and said simulation executing means executes transient analysis processing by using the second net list produced with respect to said new second circuit wherein said simulation executing means, in said settling time setting processing, measures a time from a rise and a fall of an operation clock applied to said analog/digital mixed circuit until when an output signal of said analog/digital mixed circuit settles, and sets a pulse width of said dummy pulse signal, and in transient analysis processing, jointly employs, as settling points, an analysis point set according to a time step analysis method and a measurement point set based on the tiring of a rise and a fall of said dummy pulse to execute transient analysis.

3. A transient analysis method of conducting transient analysis processing of an analog/digital mixed circuit, comprising the steps of:

producing a first circuit diagram of an analog/digital mixed circuit to be analyzed;

producing a first net list corresponding to said first circuit diagram;

measuring a settling time corresponding to an output signal of an analog circuit unit in said analog/digital mixed circuit by using said first net list;

determining a parameter of a dummy pulse signal based on said result of measurement of the settling time to add a dummy pulse generation circuit for generating a dummy pulse for setting a settling point for use in transient analysis to said analog/digital mixed circuit to produce a new second circuit;

producing a second net list corresponding to the new second circuit obtained as a result of the addition of said dummy pulse generation circuit to said analog/digital mixed circuit; and conducting transient analysis by using said second net list, and comprising the step of jointly employing an analysis point set according to a time step analysis method and a measurement point set based on the timing of a rise and a fall of said dummy pulse as settling points for use in transient analysis processing.

4. A transient analysis method of conducting transient analysis processing of an analog/digital mixed circuit, comprising the steps of:

producing a first circuit diagram of an analog/digital mixed circuit to be analyzed;

producing a first net list corresponding to said first circuit diagram;

measuring a settling time corresponding to an output signal of an analog circuit unit in said analog/digital mixed circuit by using said first net list;

determining a parameter of a dummy pulse signal based on said result of measurement of the settling time to add a dummy pulse generation circuit for generating a dummy pulse for setting a settling point for use in transient analysis to said analog/digital mixed circuit to produce a new second circuit;

producing a second net list corresponding to the new second circuit obtained as a result of the addition of said dummy pulse generation circuit to said analog/digital mixed circuit; and conducting transient analysis by using said second net list, and wherein said settling time measuring step comprises the steps of:

measuring a time from a rise and a fall of an operation clock applied to said analog/digital mixed circuit until when an output signal of said analog/digital mixed circuit settles, and setting a pulse width of said dummy pulse signal based on said measurement result, and said transient analysis executing step comprises the step of:

jointly employing an analysis point set according to a time step analysis method and a measurement point set based on the timing of a rise and a fall of said dummy pulse as settling points for use in transient analysis processing.

5. A computer readable memory storing a control program for controlling a transient analysis device which conducts transient analysis processing of an analog/digital mixed circuit, and control program comprising the steps of:

producing a first circuit diagram of an analog/digital mixed circuit to be analyzed;

producing a first net list corresponding to said first circuit diagram;

measuring a settling time corresponding to an output signal of an analog circuit unit in said analog/digital mixed circuit by using said first net list;

determining a parameter of a dummy pulse signal based on said result of measurement of a settling time to add a dummy pulse generation circuit for generating a dummy pulse for setting a settling point for use in transient analysis to said analog/digital mixed circuit to produce a new second circuit;

producing a second net list corresponding to the new second circuit obtained as a result of the addition of said dummy pulse generation circuit to said analog/digital mixed circuit; and conducting transient analysis by using said second net list, and comprising the step of jointly employing an analysis point set according to a time step analysis method and a measurement point set based on the timing of a rise and a fall of said dummy pulse as settling points for use in transient analysis processing.

6. A computer readable memory storing a control program for controlling a transient analysis device which conducts transient analysis processing of an analog/digital mixed circuit, and control program comprising the steps of:

producing a first circuit diagram of an analog/digital mixed circuit to be analyzed;

producing a first net list corresponding to said first circuit diagram;

measuring a settling time corresponding to an output signal of an analog circuit unit in said analog/digital mixed circuit by using said first net list;

determining a parameter of a dummy pulse signal based on said result of measurement of a settling time to add a dummy pulse generation circuit for generating a dummy pulse for settting a settling point for use in transient analysis to said analog/digital mixed circuit to produce a new second circuit;

producing a second net list corresponding to the new second circuit obtained as a result of the addition of said dummy pulse generation circuit to said analog/digital mixed circuit; and conducting transient analysis by using said second net list, and wherein said settling time measuring step of said control program comprises the steps of:

measuring a time from a rise and a fall of an operation clock applied to said analog/digital mixed circuit until when an output signal of said analog/digital mixed circuit settles, and setting a pulse width of said dummy pulse signal based on said measurement result, and said transient analysis executing step comprises the step of:

jointly employing an analysis point set according to a time step analysis method and a measurement point set based in the timing of a rise and a fall of said dummy pulse as settling points for use in transient analysis processing.

* * * * *

UNITED STATES PATENT AND TRADEMARK OFFICE
CERTIFICATE OF CORRECTION

PATENT NO.   : 6,230,294 B1
DATED        : May 8, 2001
INVENTOR(S)  : T. Saito

It is certified that error appears in the above-identified patent and that said Letters Patent is hereby corrected as shown below:

Column 10, claim 1,
Line 9, "Finction" should read -- Function --

Column 10, claim 2,
Line 63, "tiring" should read -- timing --

Signed and Sealed this

Eighth Day of January, 2002

Attest:

Attesting Officer

JAMES E. ROGAN
Director of the United States Patent and Trademark Office